(12) United States Patent
Chang et al.

(10) Patent No.: US 10,361,105 B2
(45) Date of Patent: Jul. 23, 2019

(54) DETERMINING CRITICAL PARAMETERS USING A HIGH-DIMENSIONAL VARIABLE SELECTION MODEL

(71) Applicant: KLA-TENCOR CORPORATION, Milpitas, CA (US)

(72) Inventors: Wei Chang, Foster City, CA (US); Joseph Gutierrez, Santa Clara, CA (US); Krishna Rao, San Ramon, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 673 days.

(21) Appl. No.: 14/955,752

(22) Filed: Dec. 1, 2015

(65) Prior Publication Data

US 2016/0163574 A1    Jun. 9, 2016

Related U.S. Application Data

(60) Provisional application No. 62/087,187, filed on Dec. 3, 2014, provisional application No. 62/183,101, filed on Jun. 22, 2015.

(51) Int. Cl.
*H01L 21/67*   (2006.01)
*G06N 7/00*    (2006.01)
*G05B 19/418*  (2006.01)

(52) U.S. Cl.
CPC .. *H01L 21/67253* (2013.01); *G05B 19/41875* (2013.01); *G06N 7/00* (2013.01); *Y02P 90/22* (2015.11); *Y02P 90/86* (2015.11)

(58) Field of Classification Search
CPC ................................................ H01L 21/67253
See application file for complete search history.

(56) References Cited

U.S. PATENT DOCUMENTS 5,528,510 A    6/1996   Kraft
7,454,312 B2   11/2008  Weiher et al.
(Continued)

FOREIGN PATENT DOCUMENTS

CN      103488135 A    1/2014
EP        1132792 A2   12/2001

OTHER PUBLICATIONS

International Search Report, PCT/US2015/063463, ISA/KR, dated Apr. 12, 2016.
(Continued)

*Primary Examiner* — John E Breene
*Assistant Examiner* — Jeffrey C Morgan
(74) *Attorney, Agent, or Firm* — Hodgson Russ LLP

(57) ABSTRACT

A high-dimensional variable selection unit determines a list of critical parameters from sensor data and parametric tool measurements from a semiconductor manufacturing tool, such as a semiconductor inspection tool or other types of semiconductor manufacturing tools. The high-dimensional variable selection model can be, for example, elastic net, forward-stagewise regression, or least angle regression. The list of critical parameters may be used to design a next generation semiconductor manufacturing tool, to bring the semiconductor manufacturing tool back to a normal status, to match a semiconductor manufacturing tool's results with that of another semiconductor manufacturing tool, or to develop a specification for the semiconductor manufacturing tool.

11 Claims, 7 Drawing Sheets

(56) References Cited

U.S. PATENT DOCUMENTS

| | | | |
|---|---|---|---|
| 7,656,176 | B2 | 2/2010 | Yoshioka et al. |
| 8,255,346 | B2 | 8/2012 | Abe et al. |
| 8,285,414 | B2 | 10/2012 | Aharoni et al. |
| 8,346,688 | B2 | 1/2013 | Carroll et al. |
| 2008/0195359 | A1 | 8/2008 | Barker et al. |
| 2008/0252908 | A1 | 10/2008 | Jin et al. |
| 2013/0066582 | A1 | 3/2013 | Pelz et al. |
| 2014/0135970 | A1 | 5/2014 | Kaushal et al. |
| 2014/0222376 | A1 | 8/2014 | Kao et al. |
| 2016/0041292 | A1* | 2/2016 | Wahrlich .......... G01V 3/10 324/329 |

OTHER PUBLICATIONS

Zou & Hastie, "Regularization and Variable Selection via the Elastic Net," J. of the Royal Statistical Society, 2005, Series B, Part 2, pp. 301-320.

Zou & Hastie, "Regularization and Variable Selection via the Elastic Net," Dept. of Statistics, Stanford University, Apr. 21, 2005, available at http://web.stanford.edu/~hastie/TALKS/enet_talk.pdf.

Zou, "Package 'elasticnet,'" 2012, pp. 1-14, available at http://cran.r-project.org/web/packages/elasticnet/elasticnet.pdf.

Fan & Lv, "A Selective Overview of Variable Selection in High Dimensional Feature Space," 2009, pp. 1-44, available at http://arxiv.org/abs/0910.1122.

Fan, "Variable Screening in High-Dimensional Feature Space," ICCM 2007, 2007, vol. II, pp. 735-747.

Sartori, "Penalized Regression: Bootstrap Confidence Intervals and Variable Selection for High Dimensional Data Sets," University of Milan, 2009-2010, pp. 1-134.

McConaghy, "High-Dimensional Statistical Modeling and Analysis of Custom Integrated Circuits," IEEE Custom Integrated Circuits Conference, Sep. 2011, pp. 1-8.

Susto, "Statistical Methods for Semiconductor Manufacturing," Dept. of Information Engineering, University of Padova, 2013, pp. 1-182.

* cited by examiner

DETERMINING CRITICAL PARAMETERS USING A HIGH-DIMENSIONAL VARIABLE SELECTION MODEL

CROSS-REFERENCE TO RELATED APPLICATIONS

This application claims priority to the provisional patent application filed Dec. 3, 2014 and assigned U.S. App. No. 62/087,187 and to the provisional patent application filed Jun. 22, 2015 and assigned U.S. App. No. 62/183,101, the disclosures of which are hereby incorporated by reference.

FIELD OF THE DISCLOSURE

This disclosure relates to models for determining critical parameters in manufacturing tools.

BACKGROUND OF THE DISCLOSURE

In semiconductor manufacturing processes, tool matching is used to ensure two or more of the same model of a semiconductor manufacturing tool ("tool") produce similar results. The tool may be, for example, a semiconductor inspection tool ("inspection tool"). Tool matching may be particularly important for inspection tools. Variations between of inspection results from the same type of inspection tool can impact the root-cause analysis for the manufacturing process. For example, the actual semiconductor manufacturing drift may be confused with the variation in the inspection tools. This also may be important in other tools because other types of result variances, such as, for example, deposition thickness, chemical mechanical polishing uniformity, or ion implant angle, can impact root-cause analysis.

A semiconductor manufacturer usually performs an inspection tool matching exercise during periodic preventative maintenance (PM). Due to limited maintenance schedules, a field service engineer may only have one day to complete the PM, including a tool matching exercise. As inspection tools offer more powerful functionality and flexibility to semiconductor manufacturers, these inspection tools have become remarkably complex. Tens of thousands of parameters are tracked, and the collected data can be overwhelming for the field service engineer. It is extremely cumbersome for a field service engineer to review tens of thousands of parameters to determine the correct parameter(s) to adjust to match an inspection tool.

The complexity of inspection tools grows with each generation. Knowing the critical parameters that significantly impact tool performance helps engineers make decisions on which components or subsystems to improve in current and next generation inspection tools. Tool specifications need to be developed when inspection tools are manufactured. It is impractical to develop thousands of specifications for a tool. And it is very challenging to pick a handful of tool parameters out of over 10,000 measurable parameters that accurately characterize the performance of a tool. This small subset of parameters serves as the fingerprint of the tool and is sufficient to capture most of the tool variations, which makes it important to select the best tool parameters for the set.

In the current approach, a special wafer with known defect locations and sizes called a Defect Standard Wafer ("DSW wafer") is created. An inspection tool uses the DSW wafer to compare the detected defect area with the actual defect area of the DSW wafer and can, for example, output a similarity score between 0 and 1. The similarity score, referred to as "Match Factor" or other tool performance measurements, measures the performance of an inspection tool at a system level. Systems engineers correlate one tool parameter at a time to Match Factor to examine which parameters can affect tool performance. Since a systems engineer cannot repeat this exercise for all tool parameters in a reasonable amount of time, the choice of parameters to investigate are purely based on the systems engineer's subjective discretion and experience. This can result in critical parameters being overlooked. Another drawback of a "one parameter at a time" approach is that it misses the interaction between the parameters. For example, an engineer may find two parameters have high impact on Match Factor. But these two parameters may be highly correlated. For example, one can be the surrogate of the other one. Thus, monitoring and creating specifications for both parameters may be redundant. Besides the performance measurement at a system level, this approach can also be applied to the a tool's sub-systems and function components.

Other statistical process control methods focus on seeking a single effective tool parameter to monitor tool excursions. However, this method may be ineffective for tools with a large volume of tool parameters. Furthermore, parameters may be inter-related or may not have enough of an effect to merit consideration, which may mean that the effective tool parameter can have an unintended effect or may not provide the largest potential effect. Therefore, what is needed is a technique that can quickly navigate a massive number of tool parameters and identify a few most important parameters that can affect tool performance.

BRIEF SUMMARY OF THE DISCLOSURE

In a first embodiment, a system is provided. The system includes an input unit configured to receive a plurality of sensor data and parametric tool measurements from a semiconductor manufacturing tool; a high-dimensional variable selection unit in electronic communication with the input unit configured to determine a list of critical parameters from the plurality of sensor data and parametric tool measurements; and an output unit in electronic communication with the high-dimensional variable selection unit configured to communicate the critical parameters. A display configured to display the critical parameters may be connected to the output unit.

The semiconductor manufacturing tool may be a semiconductor inspection tool. The semiconductor manufacturing tool may include a stage, a light source, an image processor, and optics connected to the input unit.

In a second embodiment, a method is provided. In the method, a plurality of sensor data and parametric tool measurements is received from a semiconductor manufacturing tool. The plurality of sensor data and parametric tool measurements is analyzed using a high-dimensional variable selection model. A list of critical parameters is generated from the plurality of sensor data and parametric tool measurements using the analyzed sensor data and parametric tool measurements. The semiconductor manufacturing tool may be a semiconductor inspection tool.

A setting for at least one of the critical parameters on the semiconductor manufacturing tool may be modified to bring the semiconductor manufacturing tool back to a normal status. A setting for at least one of the critical parameters on the semiconductor manufacturing tool may be modified to match results of the semiconductor manufacturing tool with that of another semiconductor manufacturing tool. A specification for the semiconductor manufacturing tool may be developed based on the list of critical parameters.

The high-dimensional variable selection model may include one of elastic net, forward-stagewise regression, or least angle regression. The high-dimensional variable selection model may include a formula $(\min(Y-BX))^2+\lambda(\|X\|+\|X\|^2)$, wherein Y is a performance measurement of the semiconductor manufacturing tool, X is a vector of input parameter, B is a vector of coefficient to estimate, and $\lambda$ controls a degree that parameter coefficients are penalized.

The plurality of sensor data and parametric tool measurements may be collected while the semiconductor manufacturing tool is idle.

The high-dimensional variable selection model may be re-parameterized in a hierarchical manner.

In a third embodiment, a device for determining a list of critical parameters is provided. The device includes a processor; an electronic storage device in electronic communication with the processor; and a communication port in electronic communication with the processor. The processor is programmed to: receive a plurality of sensor data and parametric tool measurements from a semiconductor manufacturing tool at the communication port; analyze the plurality of sensor data and parametric tool measurements using a high-dimensional variable selection model; and generate a list of critical parameters from the plurality of sensor data and parametric tool measurements using the analyzed sensor data and parametric tool measurements.

The high-dimensional variable selection model may include one of elastic net, forward-stagewise regression, or least angle regression. The high-dimensional variable selection model may include a formula $(\min(Y-BX))^2+\lambda(\|X\|+\|X\|^2)$, wherein Y is a performance measurement of the semiconductor manufacturing tool, X is a vector of input parameter, B is a vector of coefficient to estimate, and $\lambda$ controls a degree that parameter coefficients are penalized.

The semiconductor manufacturing tool may be a semiconductor inspection tool.

The processor can be further programmed to collect the plurality of sensor data and parametric tool measurements while the semiconductor manufacturing tool is idle.

The processor can be further programmed to re-parameterize the high-dimensional variable selection model in a hierarchical manner.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein can quickly navigate a massive number of tool parameters and identify a few most important parameters that can affect tool performance. Unlike other statistical process control methods that focus on seeking an effective tool parameter to monitor tool excursions, embodiments disclosed herein provide a high-dimensional statistical approach to prioritize a tool's unique critical parameters that affect tool performance. This invention can be particularly helpful when a complex tool, such as an inspection tool, has over 7,000 parameters to consider and prioritize for product development, manufacturing process, and service.

Figure 1:
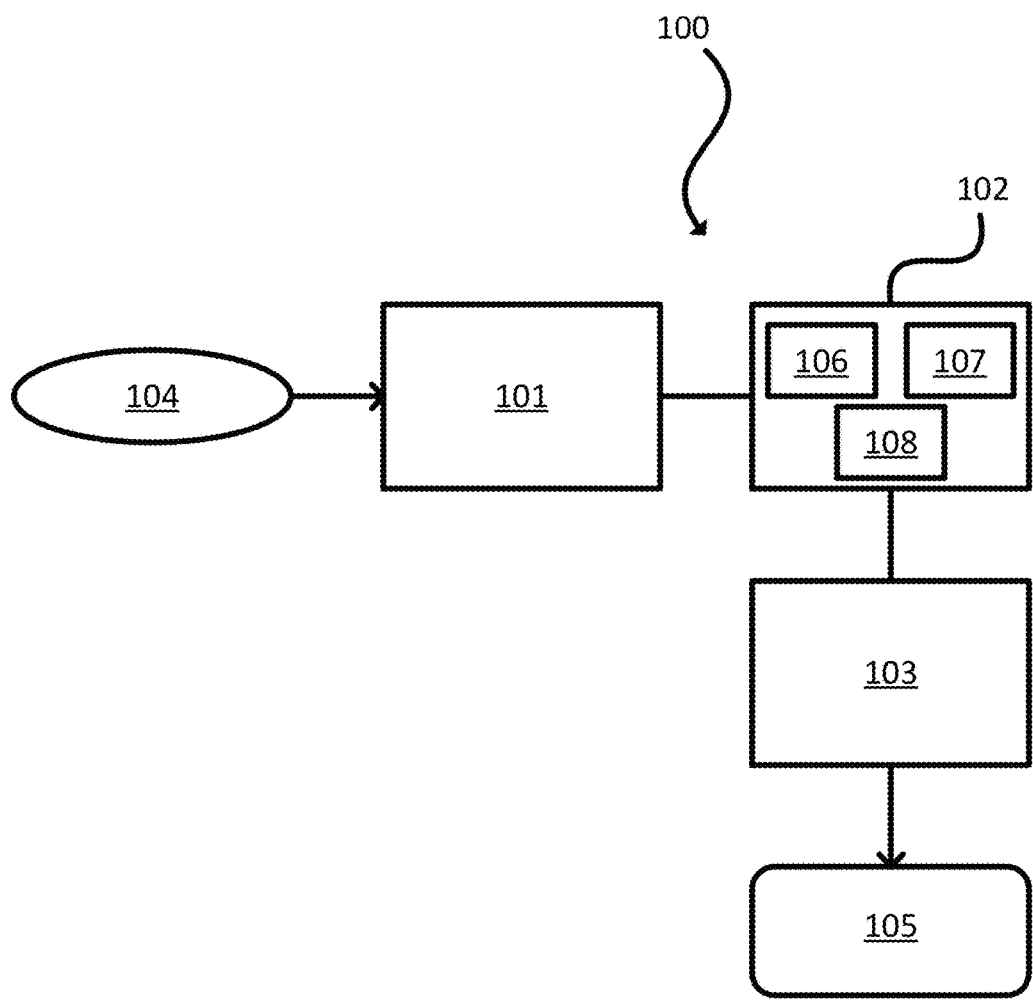
FIG. 1 is block diagram of an embodiment of a system using a high-dimensional variable selection unit in accordance with the present disclosure.

FIG. 1 is block diagram of a system 100 using a high-dimensional variable selection (HDVS) unit 102. An input unit 101 and output unit 103 are in electronic communication with the HDVS unit 102. The input unit 101 is configured to receive sensor data and parametric tool measurements from a tool 104. The connection between the input unit 101 and tool 104 may be, for example, wireless or hardwired. The output unit 103 is configured to communicate the critical parameters. For example, the output unit 103 may send the critical parameters to a display 105. The output unit 103 also may generate a report, prepare a spreadsheet, print a document, or communicate with a portable device.

Sensor data can be regular data from tool sensors, such as temperature or pressure. Some parametric tool data is derived from sensor data to measure certain aspects of tool status or performance. For example, headroom is parametric tool data calculated from data from a tool's light sensors.

The tool 104 may be an inspection tool, metrology tool, etching tool, deposition tool, chemical mechanical polishing tool, ion implanter, or other piece of semiconductor manufacturing equipment. In an instance, the tool 104 is an inspection tool, such as an inspection tool for defect inspection. Such an inspection tool may include, for example, a stage, a light source, an image processor, and optics that are in electronic communication with the input unit 101. In an instance, a controller for the tool 104 communicates with the input unit 101 regarding the various components of the inspection tool.

The HDVS unit 102 is configured to determine a list of critical parameters from the sensor data and parametric tool measurements. The HDVS unit 102 can include a processor 106, an electronic storage device 107 in electronic communication with the processor 106, and a communication port 108 in electronic communication with the processor 106.

Figure 2:
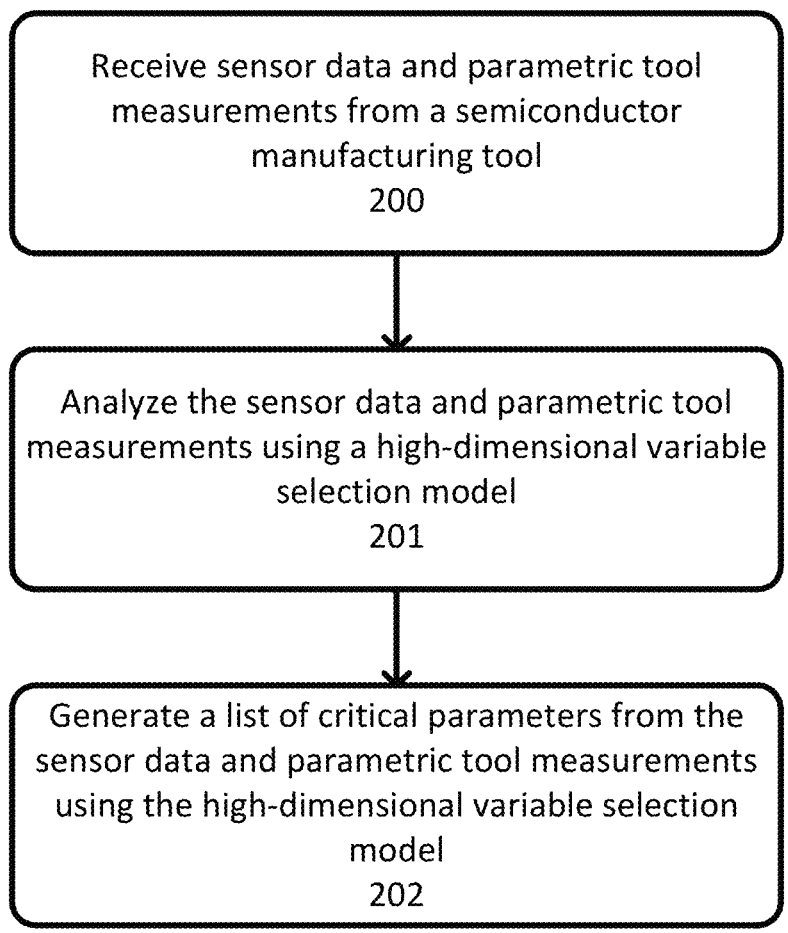
FIG. 2 is a flowchart of an embodiment of a process in accordance with the present disclosure.

FIG. 2 is a flowchart of an embodiment of a process for determining critical parameters using a high-dimensional variable selection model. At 200, sensor data and parametric tool measurements are received from a tool, such as the tool 104 in FIG. 1. At 201, the sensor data and parametric tool measurements are analyzed using a HDVS model. This may occur in, for example, the HDVS unit 102 of FIG. 1. At 202, a list of critical parameters is generated from the sensor data and parametric tool measurements using the HDVS model.

A critical parameter is one that has a significant desirable effect on calibration or tool performance measurement such as Match Factor. Thus, a critical parameter may be one that has an effect that exceeds a threshold. This threshold may be set by an operator, by the HDVS unit 102, or using other techniques. Such a threshold can vary based on the application. For example, a threshold may be higher or lower for a particular semiconductor manufacturer, semiconductor design, or tool model. A threshold for critical parameters may be varied after further investigation. Compared to a regular parameter, a critical parameter may be used to characterize a specific process and influence the statistical process control in manufacturing. Critical parameters may not tie to parameters with a specification and/or threshold. Critical parameters can be a subset of all available tool measurements that have a larger influence or the largest influence on tool performance and can be used to explain most of tool variation In an instance, the sensor data and parametric tool measurements are collected while the tool is idle. When a major PM is performed, a more comprehensive tool data set including the DSW Match Factor can be acquired. When new DSW Match Factor data becomes available, a data consolidation and preprocess procedure can automatically associate historical tool parameters at different timestamps with a DSW Match Factor. In particular, for a DSW Match Factor, the most recent value of a tool parameter that falls into a predefined time window will be retained.

The HDVS model can use regression analysis to estimate relationships among the variables, such as the sensor data and parametric tool measurements. The HDVS model described herein can be, for example, elastic net, forward-stagewise regression, least angle regression, or other statistical models. The actual model may vary depending on the application, the tool, or the data available. Although the results from elastic net, forward-stagewise regression, and least angle regression are usually consistent and overlapping, elastic net may be selected due to its computational efficiency.

Elastic net is a regularized regression model that linearly combines the L1 and L2 penalties of the LASSO (Least Absolute Shrinkage and Selection Operator) and ridge regression methods. Ridge regression is also known as Tikhonov regularization and results in a quadratic term. Elastic net regularization utilizes the quadratic ridge regression term to overcome the two limitations of LASSO: (1) in the case of large number of variables p, small number of sample data n, selecting, at most, m variables before saturation; and (2) in the case of highly correlated variables, selecting one variable from a group and ignoring the other. The elastic net model may be advantageous in high-dimensional data sets with few examples. An elastic net model simultaneously performs automatic variable selection and continuous shrinkage, and it can select groups of correlated variables.

Forward stagewise regression is a regression model that finds the variable with the most explanatory power and updates the weight of that variable in a correct direction. Forward stagewise regression is a cautious version of forward selection, and is an iterative procedure to build a regression function in successive small steps. Forward stagewise regression follows a strategy for constructing a sequence of sparse regression estimates. It starts with all coefficients equal to zero, and iteratively updates the coefficient of the variable (by a small amount) that achieves the maximal absolute inner product with the current residual.

Least angle regression (LARS) is a regression model selection method. LARS can be considered a computationally faster version of forward stagewise regression, and is motivated by the fact that it is relatively easy to identify the points where the infinitesimal version of a stagewise procedure would turn a corner and start following a new vector. LARS makes optimized leaps in optimal directions that are chosen to make equal correlations with each of the variables in the model. LARS is similar to forward regression, but instead of including variables at each step, the estimated parameters are increased in a direction equiangular to each one's correlations with the residual. LARS produces a full piecewise linear solution path, which is useful in cross-validation of similar attempts to tune the model. At each stage, the LARS estimate approaches, but never reaches, the corresponding ordinary least squares estimate.

In an example, elastic net can be used as the HDVS model. Elastic net may add regularization terms into a regular multiple regression model to penalize excessive number of parameters in the model, which may be beneficial. An embodiment of elastic net uses Equation 1 below.

$$(\min(Y-BX))^2 + \lambda(\|X\| + \|X\|^2) \qquad \text{(Eq. 1)}$$

Figure 3:
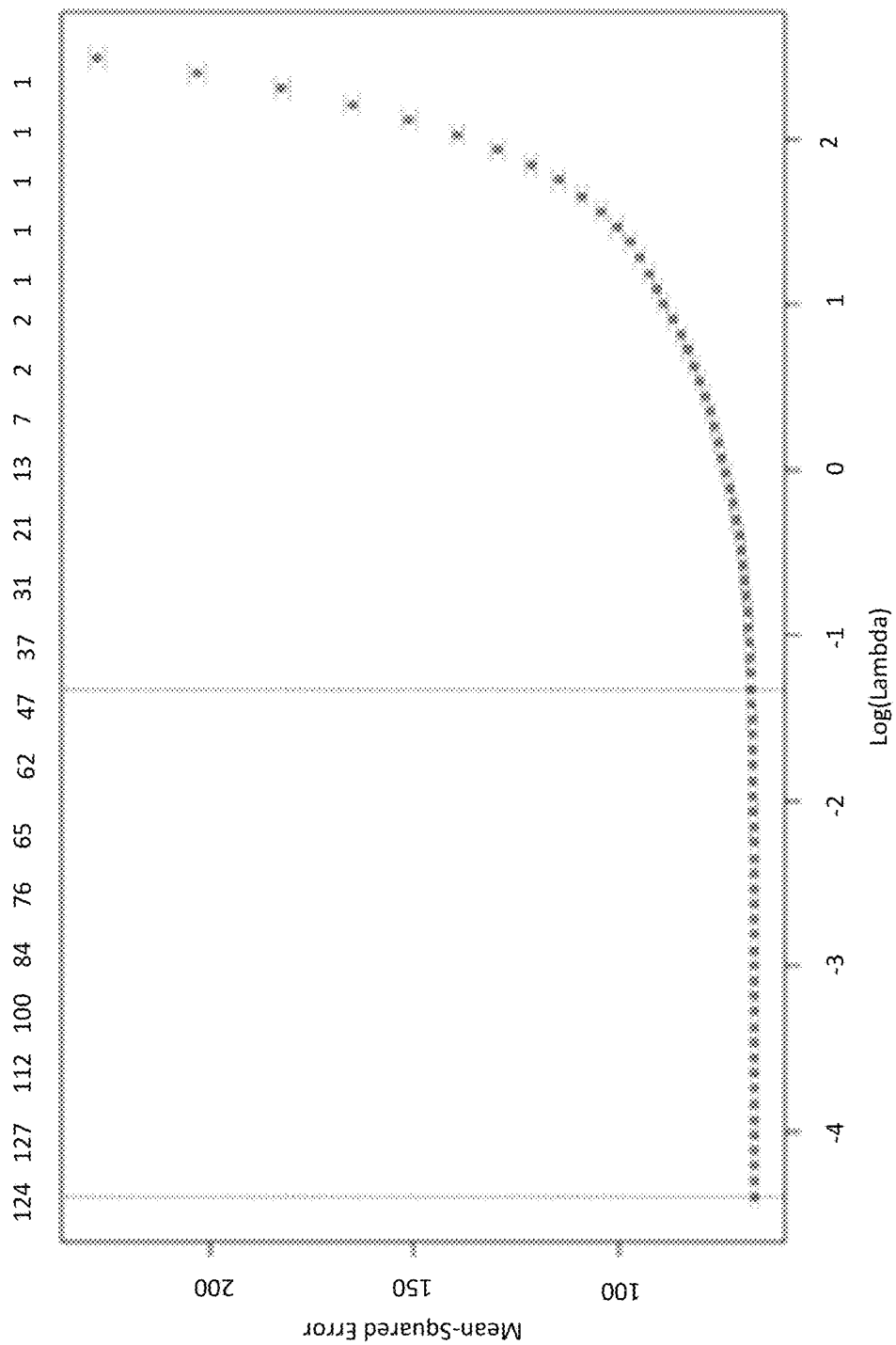
FIG. 3 is an exemplary result using elastic net.

In Equation 1, Y is a performance measurement of the tool such as DSW Match Factor, X is a vector of input parameter, B is a vector of coefficient to estimate, and $\lambda$ controls a degree that parameter coefficients are penalized. As seen in FIG. 3, the number on the top of the chart are the numbers of parameters that have non-zero coefficients. Only parameters with non-zero coefficients can affect DSW Match Factor. The $\lambda$ variable controls model complexity (i.e., the number of parameters and prediction error). Looking at FIG. 3 from right to left, when $\lambda$ is large enough, all parameter coefficients shrink to zero. As $\lambda$ increases gradually, more variables will have non-zero coefficients and these variables can have high impact on the DSW Match Factor or other tool performance measurement. The vertical axis, mean-square error, is a measure of prediction accuracy. In one particular example, after 78 parameters have entered the model, the benefit by adding more parameters into the HDVS model is marginal. The HDVS model then outputs 78 parameters as the most critical parameters.

The high-dimensional variable selection model can be re-parameterized in a hierarchical manner. For example, see Equations 2 and 3 below.

$$\min(Y - \Sigma B_i X_i)^2 \qquad \text{(Eq. 2)}$$

$$X_i = \Gamma Z + \lambda_i(\|\Gamma\| + \|\Gamma\|^2) \qquad \text{(Eq. 3)}$$

In Equations 2 and 3, Y is a performance measurement of the tool such as DSW Match Factor, Z is a vector of input parameter for each sub-system i, $X_i$ is a hidden variable to estimate the performance at sub-system level. $\Gamma$ is the weight of each input parameter within its sub-system while B is the weight factor of each sub-system to overall tool performance, and $\lambda$ controls a degree that parameter coefficients are penalized.

A tool may be complex and may include several subsystems. In an inspection tool, these subsystems may include, for example, a stage, a light source, an image processor, and optics. A systems engineer may want to understand how the performance of each subsystem or other component can be characterized by a small set of tool parameters or how all subsystems parameters or other components collectively affect the overall tool performance. In Equation 2, a regular regression model describes the relationship between the tool performance Y and the performance of each subsystem $X_i$. Equation 3 models how the measured variables Z affect the performance of a particular subsystem. Note that regularization term $\lambda_i$ is introduced for each sub-system so as the model only chooses essential variables that affect the corresponding subsystem.

Figure 7:
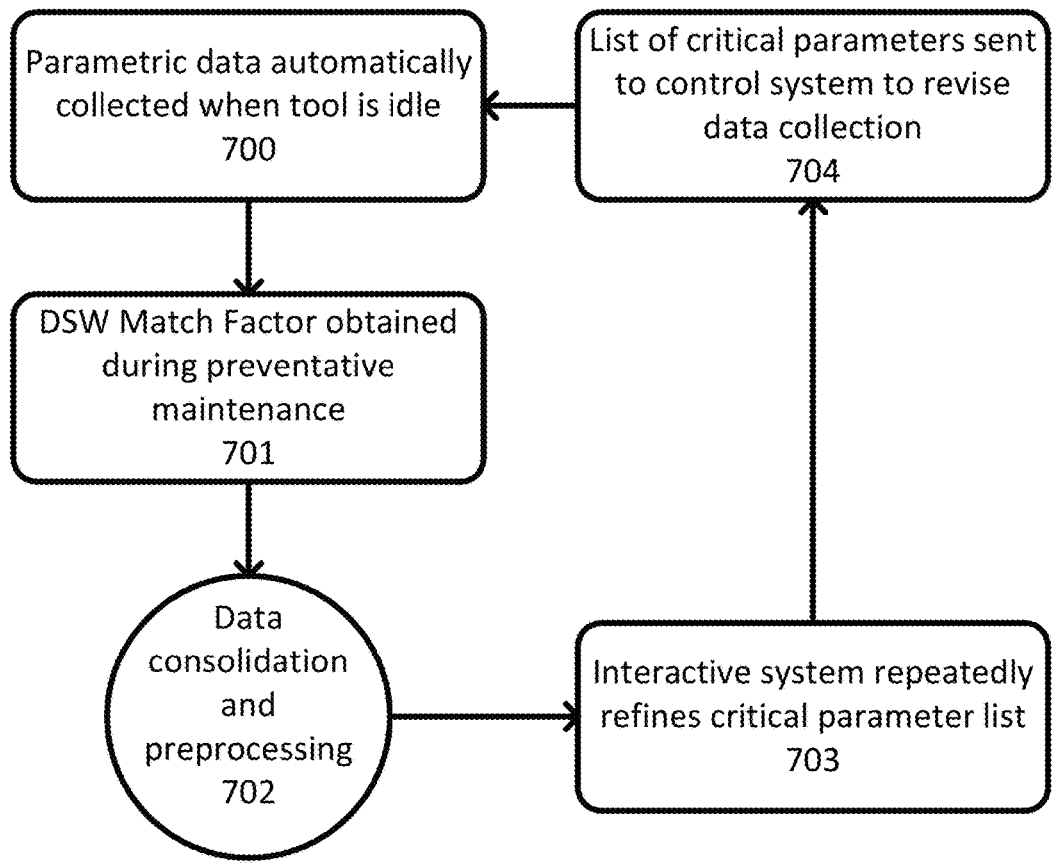
FIG. 7 is a flowchart of a workflow embodiment in accordance with the present disclosure.

After the critical parameter list is refined, such as by a systems engineer or via software, the HDVS model can be re-run and optionally refined. This process can be repeated until the systems engineer is satisfied with the output, as seen in FIG. 7. Parametric data is automatically collected when the tool is idle 700. DSW Match Factor is obtained during PM 701. This parametric and/or DSW Match Factor data is consolidated and preprocessed 702 before an interactive system repeatedly refines a critical parameter list 703. The list of critical parameters is sent to a control system to revise data collection 704. A control system can be used to direct which parameters will be collected in the future based on recommendation from the HDVS model-human refinement engine seen in FIG. 7.

The critical parameters can be used in multiple ways. For example, the list of critical parameters may be used to design a next generation tool, to modify a setting for at least one of the critical parameters on the tool, to bring the tool back to a normal status, to match results of the tool with that of another tool, or to develop a specification for the tool. The tool in these embodiments may be, for example, an inspection tool, etching tool, deposition tool, chemical mechanical polishing tool, ion implanter, or another piece of semiconductor manufacturing equipment.

Figure 4:
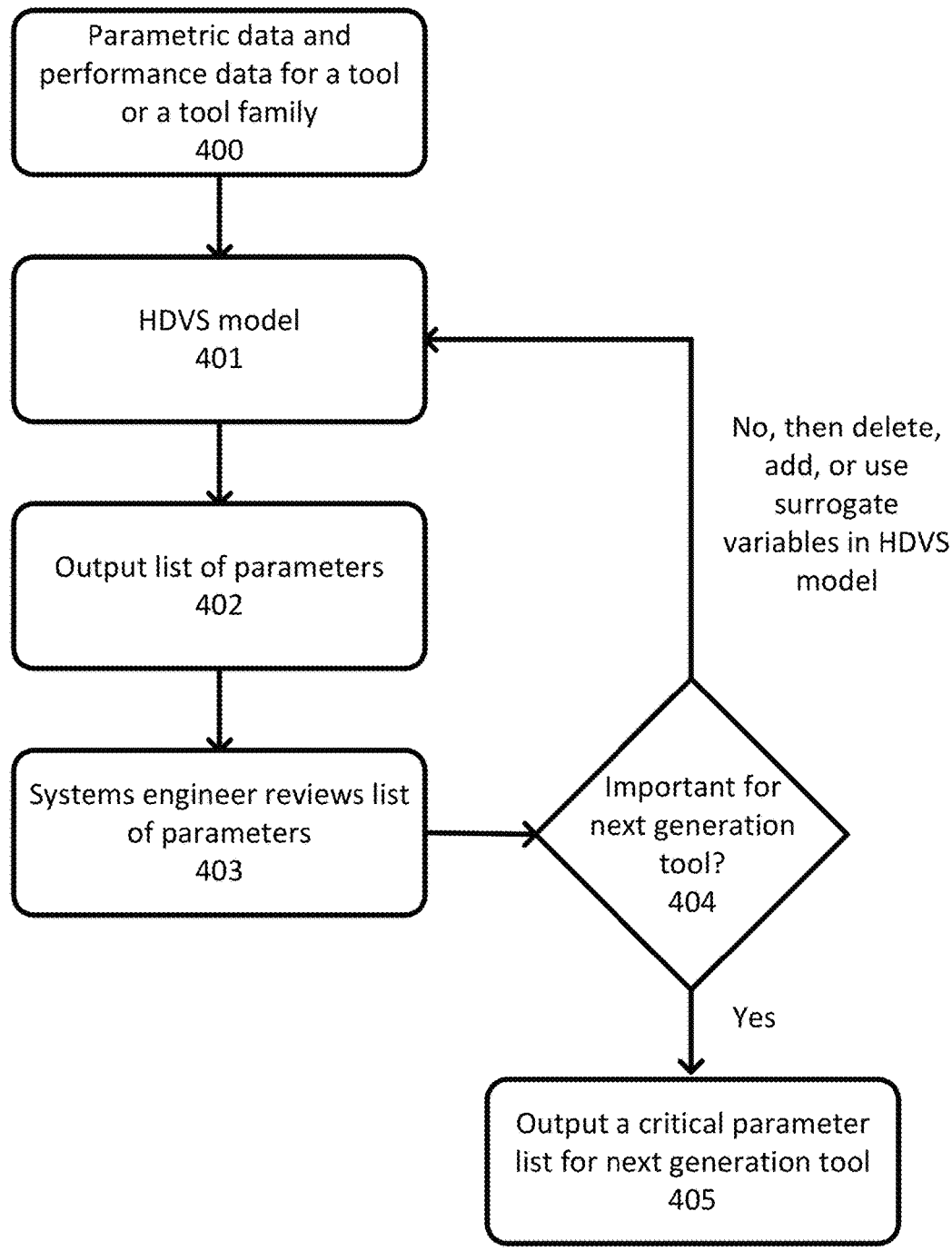
FIG. 4 is a flowchart of developing a next generation tool.

As seen in FIG. 4, the list of critical parameters can be used to design a next generation tool. During a tool manufacturing process, various sensor data and parametric tool measurements are collected to gauge the tool behavior. Periodically, the tool runs through DSW wafers to diagnose inspection capability. The system takes all parametric data and performance data 400 generated throughout the entire manufacture lifecycle. Then the system performs a HDVS model 401 to output a list of parameters 402 that the system considers as impactful to tool performance. These may be critical parameters. Afterwards, systems engineers or computer software may review the list of parameters 403 and determine whether the parameters are important for a next generation tool 404. The systems engineers may delete variables in the model that they cannot set values for in tool control system, add new variables to the model, or use variables similar to ones in the model. The system performs HDVS on the modified input variables. The iterative process continues until the systems engineers are satisfied with the suggested critical parameter list for the next generation tool development. A critical parameter list for a next generation tool is outputted 405.

Figure 5:
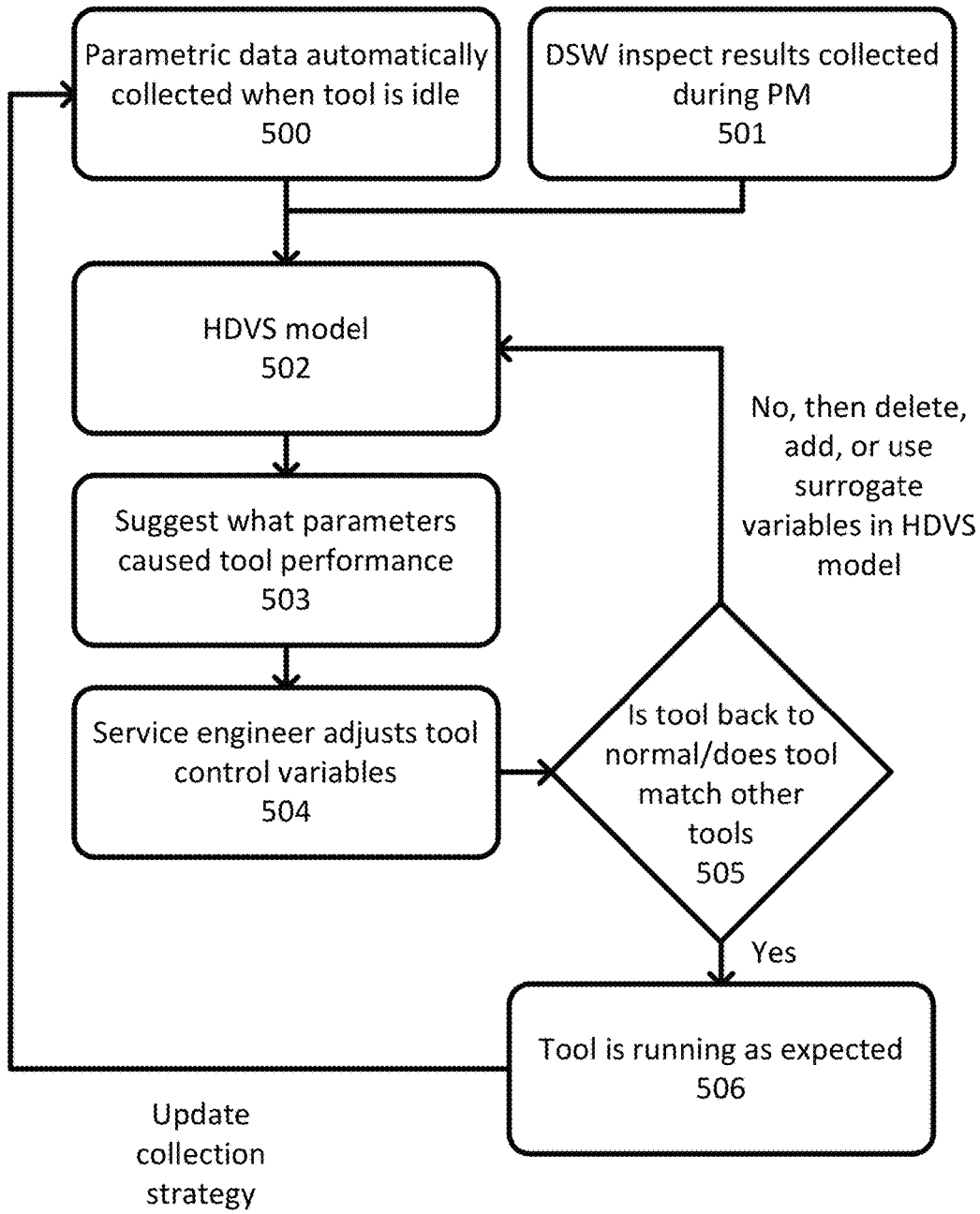
FIG. 5 is a flowchart of servicing a tool.

As seen in FIG. 5, the list of critical parameters can be used to modify a setting for at least one of the critical parameters on the tool to bring the tool back to a normal status or to match results of the tool with that of another tool. During a scheduled PM, tools may be matched to each other so that the tools will have similar results running on same wafer, such as inspection results in inspection tools. Amid an unscheduled field escalation, a service team member has limited time to identify the root causes of unexpected tool performance. The system can use parametric data automatically collected when a tool is idle 500 and DSW Match Factor data collected during PM 501, apply an HDVS model 502, and suggest a list of critical parameters to be modified to bring the tool back to normal status 503. Subsequently, the field service engineer adjusts tool parameters 504 and reruns the DSW inspection 505. If the results are still not as expected, the field service engineer can add constraints on the input parameters, remove irrelevant parameters from the output list, or suggest new parameters to the model. The iterative process continues until the tool is back to normal and matches other tools 506. The parametric data collection strategy will also be updated with the focus on collecting more critical parameter measurements.

Figure 6:
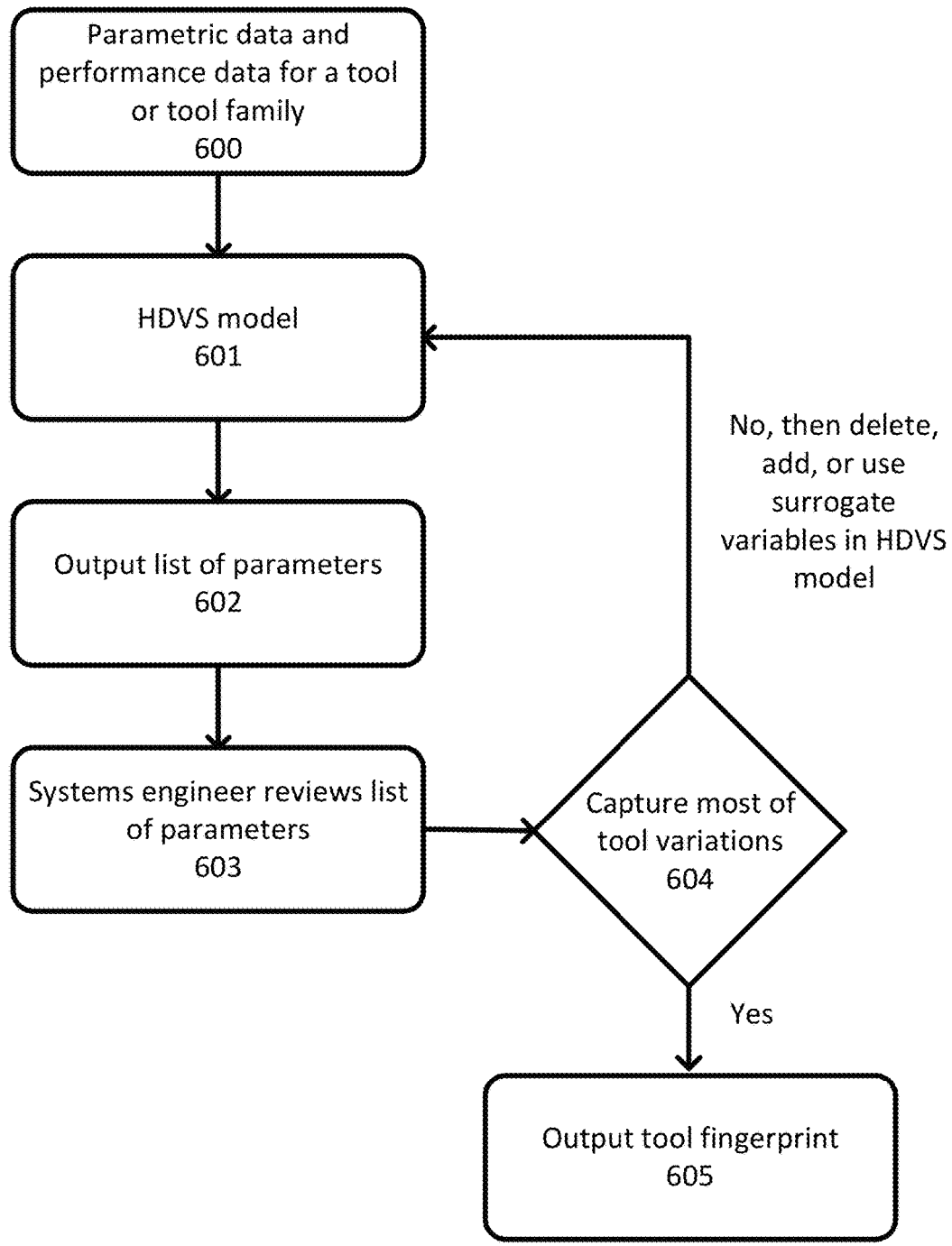
FIG. 6 is a flowchart of developing specifications for a tool.

As seen in FIG. 6, the list of critical parameters can be used to develop a specification for the tool. The specification for the tool can be used in, for example, new product development. The critical parameter list can serve as the fingerprint of a tool. Similar to what has been previously described herein, the system runs HDVS model 601 on data collected during the manufacture, such as parametric performance data for a tool or tool family 600, and outputs a list of critical parameters 602. Based on the understanding of each component of the tool, systems engineers review the list of critical parameters 603 to see whether it covers all aspect of the tool status, captures majority of tool variation 604, and/or is concise enough. It may be desired to have as few tool parameters as possible while capturing most of the tool variation, which is the balance referred to by being concise enough. If not, a systems engineer can modify the parameters in the list and rerun the HDVS model until the systems engineer is satisfied with the outcome. A systems engineer can develop the upper limit and lower limit for each parameter in the eventual list of critical parameters. A tool fingerprint can be outputted 605 if the list of critical parameters captures most of the tool variations.

By focusing on the critical parameters that are identified, time and manpower can be saved when tuning or designing a tool. In an instance, over 99% of defects on a test wafer can be identified using an inspection tool after critical parameters of this inspection tool are tuned or otherwise optimized. The amount of time needed to complete the analysis determining a list of critical parameters also decreases. For example, a tool analysis finding critical parameters that previously took months to complete can be finished in a matter of a few weeks using an embodiment of an HDVS model disclosed herein.

In an example, over 7,000 tool parameters were collected after the final tool assembly from over 120 inspection tools and fed into an HDVS model. The HDVS model quickly examined the relationship between the massive input parameters and the tool performance measured by DSW Match Factor and then narrowed down the input parameter to a list of 78 critical parameters that have high impact on tool performance. These 78 critical parameters could describe the tool performance with only 3% error. The output list assists systems engineers in filtering out noisy or irrelevant parameters and in quickly determining a list of parameters they should closely monitor and develop specifications from. The embodiments disclosed herein improve confidence in the next generation tool development, specification validation, manufacturing cycle time, and service PM definition, which make these embodiments practical for product development, manufacturing, and service.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
    receiving a plurality of sensor data and parametric tool measurements from a semiconductor manufacturing tool;
    analyzing the plurality of sensor data and parametric tool measurements using a high-dimensional variable selection model, wherein the high-dimensional variable selection model includes a formula $(\min(Y-BX))^2+\lambda(\|X\|+\|X\|^2)$, wherein Y is a performance measurement of the semiconductor manufacturing tool, X is a vector of input parameter, B is a vector of coefficient to estimate, and $\lambda$ controls a degree that parameter coefficients are penalized; and generating a list of critical parameters from the plurality of sensor data and parametric tool measurements using the analyzed sensor data and parametric tool measurements.

2. The method of claim 1, further comprising modifying a setting for at least one of the critical parameters on the semiconductor manufacturing tool to bring the semiconductor manufacturing tool back to a normal status.

3. The method of claim 1, further comprising modifying a setting for at least one of the critical parameters on the semiconductor manufacturing tool to match results of the semiconductor manufacturing tool with that of another semiconductor manufacturing tool.

4. The method of claim 1, further comprising developing a specification for the semiconductor manufacturing tool based on the list of critical parameters.

5. The method of claim 1, wherein the semiconductor manufacturing tool is a semiconductor inspection tool.

6. The method of claim 1, further comprising collecting the plurality of sensor data and parametric tool measurements while the semiconductor manufacturing tool is idle.

7. The method of claim 1, further comprising re-parameterizing the high-dimensional variable selection model in a hierarchical manner.

8. A device for determining a list of critical parameters comprising:

a processor;

an electronic storage device in electronic communication with the processor; and a communication port in electronic communication with the processor;

wherein the processor is programmed to:

receive a plurality of sensor data and parametric tool measurements from a semiconductor manufacturing tool at the communication port;

analyze the plurality of sensor data and parametric tool measurements using a high-dimensional variable selection model, wherein the high-dimensional variable selection model includes a formula $(\min(Y-BX))^2+\lambda(\|X\|+\|X\|^2)$, wherein Y is a performance measurement of the semiconductor manufacturing tool, X is a vector of input parameter, B is a vector of coefficient to estimate, and $\lambda$ controls a degree that parameter coefficients are penalized; and generate a list of critical parameters from the plurality of sensor data and parametric tool measurements using the analyzed sensor data and parametric tool measurements.

9. The device of claim 8, wherein the semiconductor manufacturing tool is a semiconductor inspection tool.

10. The method of claim 8, wherein the processor is further programmed to collect the plurality of sensor data and parametric tool measurements while the semiconductor manufacturing tool is idle.

11. The method of claim 8, wherein the processor is further programmed to re-parameterize the high-dimensional variable selection model in a hierarchical manner.

* * * * *